United States Patent
You et al.

(10) Patent No.: US 10,411,486 B2
(45) Date of Patent: Sep. 10, 2019

(54) POWER CONVERSION DEVICE

(71) Applicant: Delta Electronics (Thailand) Public Company Limited, Samutprakarn (TH)

(72) Inventors: Pei-Ai You, Samutprakarn (TH); Hao Sun, Samutprakarn (TH); Jin-Fa Zhang, Samutprakarn (TH)

(73) Assignee: DELTA ELECTRONICS (THAILAND) PUBLIC COMPANY LIMITED, Samutprakarn (TH)

(*) Notice: Subject to any disclaimer, the term of this patent is extended or adjusted under 35 U.S.C. 154(b) by 13 days.

(21) Appl. No.: 15/691,733

(22) Filed: Aug. 30, 2017

(65) Prior Publication Data

US 2018/0076640 A1    Mar. 15, 2018

(30) Foreign Application Priority Data

Sep. 9, 2016    (CN) .......................... 2016 1 0814965
Aug. 15, 2017    (CN) .......................... 2017 1 0696050

(51) Int. Cl.
| | |
|---|---|
| *H02J 7/00* | (2006.01) |
| *H02M 1/44* | (2007.01) |
| *H05K 1/02* | (2006.01) |
| *H05K 7/14* | (2006.01) |
| *B60L 53/22* | (2019.01) |

(52) U.S. Cl.
CPC ............ *H02J 7/0042* (2013.01); *B60L 53/22* (2019.02); *H02J 7/0052* (2013.01); *H02M 1/44* (2013.01); *H05K 1/0204* (2013.01); *H05K 1/0272* (2013.01); *H05K 7/1432* (2013.01); *H02J 2007/0059* (2013.01)

(58) Field of Classification Search
CPC ....... Y02E 60/12; H02J 7/0042; H02J 7/0045; H01M 10/46; H01M 10/44
USPC ........................................................ 320/107
See application file for complete search history.

(56) References Cited

U.S. PATENT DOCUMENTS

| | | | |
|---|---|---|---|
| 9,277,682 B2 | 3/2016 | Kaneko et al. | |
| 2005/0162131 A1* | 7/2005 | Sennami | H01M 2/1022 320/128 |
| 2006/0214641 A1* | 9/2006 | Cho | H01M 10/4207 320/150 |
| 2007/0126393 A1* | 6/2007 | Bersenev | H02J 7/0044 320/107 |
| 2011/0194249 A1 | 8/2011 | Nakasaka et al. | |
| 2015/0029757 A1 | 1/2015 | Kurauchi et al. | |

(Continued)

FOREIGN PATENT DOCUMENTS

| | | |
|---|---|---|
| CN | 1838463 A | 9/2006 |
| CN | 101946394 A | 1/2011 |

(Continued)

*Primary Examiner* — Arun C Williams
(74) *Attorney, Agent, or Firm* — CKC & Partners Co., LLC

(57) ABSTRACT

A power conversion device includes a thermal conductive substrate, a DC-to-DC converter circuit assembly, an on board charger module (OBCM) circuit assembly and at least one electric wire. The thermal conductive substrate has a first surface and a second surface opposite to each other. The DC-to-DC converter circuit assembly is disposed on the first surface. The OBCM circuit assembly is disposed on the first surface as well. An end of the electric wire connects with the DC-to-DC converter circuit assembly, another end of the electric wire connects with the OBCM circuit assembly.

9 Claims, 10 Drawing Sheets

(56) References Cited

U.S. PATENT DOCUMENTS

2015/0145469 A1* 5/2015 You ................. H02J 7/0042
320/107
2015/0229155 A1* 8/2015 Sporck ............. H02J 7/0073
320/107

FOREIGN PATENT DOCUMENTS

| CN | 204068669 U | 12/2014 |
| --- | --- | --- |
| CN | 104682670 A | 6/2015 |
| CN | 103187770 B | 12/2015 |
| CN | 103597729 B | 3/2016 |
| CN | 205160385 U | 4/2016 |
| CN | 205336667 U | 6/2016 |
| CN | 103947094 B | 8/2016 |
| JP | H11121690 A | 4/1999 |
| JP | 2008029117 A | 2/2008 |
| JP | 2008054384 A | 3/2008 |
| JP | 2011120389 A | 6/2011 |
| JP | 2011177024 A | 9/2011 |
| JP | 5919424 B1 | 5/2016 |
| TW | 201034354 A | 9/2010 |
| TW | I377465 B | 11/2012 |
| TW | 201521549 A | 6/2015 |
| TW | I525968 B | 3/2016 |
| WO | 2013065472 A1 | 5/2013 |
| WO | 2013080665 A1 | 6/2013 |

\* cited by examiner

POWER CONVERSION DEVICE

RELATED APPLICATIONS

This application claims priority to Chinese Application Serial Number 201610814965.3, filed Sep. 9, 2016 and Chinese Application Serial Number 201710696050.1, filed Aug. 15, 2017, which are herein incorporated by reference.

BACKGROUND

Technical Field

The present disclosure relates to a power conversion device. More particularly, the present disclosure relates a power conversion device used on an electric vehicle.

Description of Related Art

With notable features such as high efficiency, energy savings, low noise and zero emissions, etc., electric vehicles have incomparable advantages in the aspects of energy savings and environmental protection. In recent years around the world, there has been significant progress of the core and key technologies for electric vehicles, such as batteries, motors, control systems and on board charger module (OBCM) circuit assembly. Safety, reliability and working life of products have also been enhanced, as well as a gradual reduction of cost. Hybrid electric vehicles and pure electric vehicles are gradually approaching to a stage of practicality and industrialization. Electric vehicles will be a strategic direction for the development of the automobile industry all over the world.

As one of the important components of electric vehicle, the OBCM for electric vehicle is a kind of power conversion device. An input of the OBCM circuit assembly connects to a grid through input wires to receive alternating current, and an output of the OBCM circuit assembly generates a high voltage which provides the high voltage Battery Pack of the electric vehicle with charging service. In addition, the OBCM circuit assembly keeps the mutual communication with the Battery Management System (BMS) in real time through its own communication port. The enhancement of the overall performance and the cost control of the OBCM circuit assembly is one of the major factors constraining large-scale mass production of electric vehicles. Meanwhile, the electric performance, the structural design and the thermal management are key factors to comprehensively evaluate and measure the performance of the OBCM circuit assembly.

SUMMARY

A technical aspect of the present disclosure is to provide a power conversion device, which can effectively reduce its overall volume.

According to an embodiment of the present disclosure, a power conversion device includes a thermal conductive substrate, a DC-to-DC converter circuit assembly, an on board charger module circuit assembly and at least one electric wire. The thermal conductive substrate has a first surface and a second surface opposite to each other. The DC-to-DC converter circuit assembly is disposed on the first surface. The on board charger module circuit assembly is disposed on the first surface as well. An end of the electric wire connects with the DC-to-DC converter circuit assembly, another end of the electric wire connects with the on board charger module circuit assembly.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
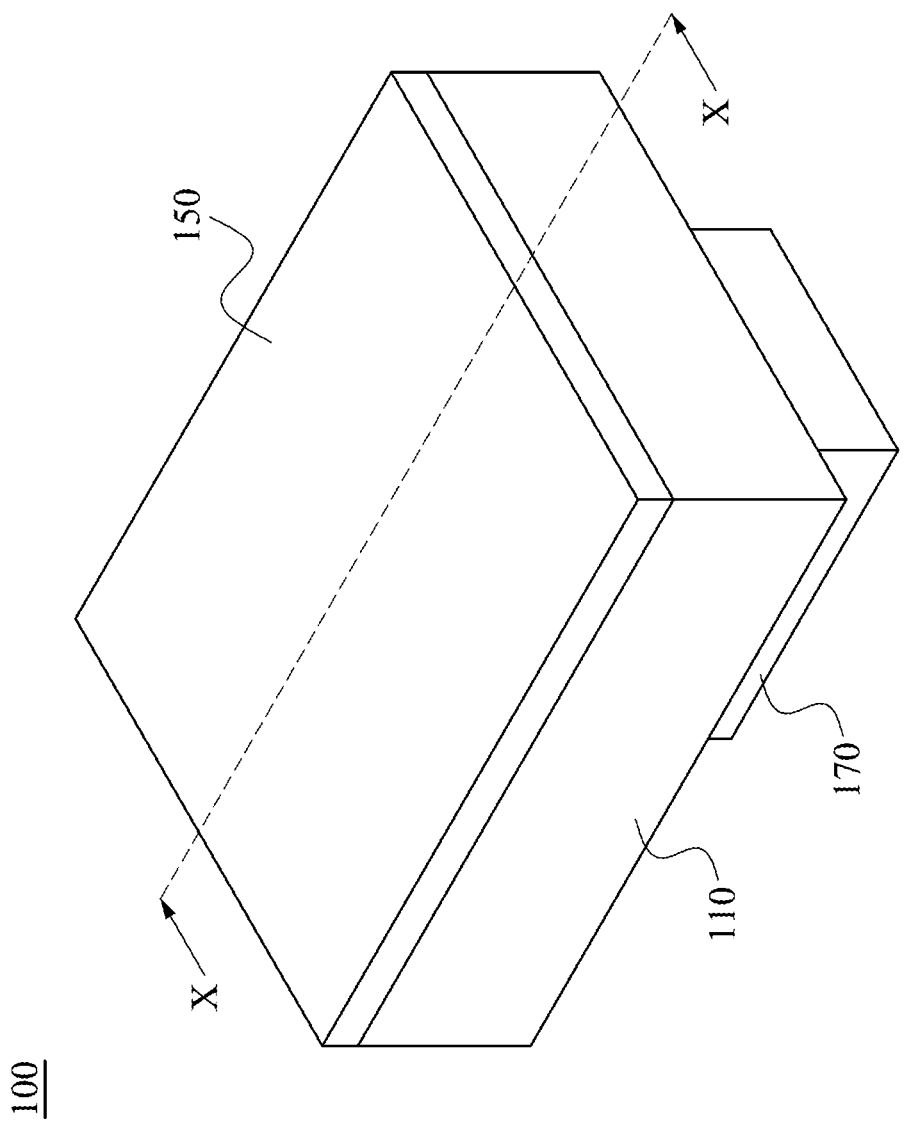
FIG. 1 is an assembly drawing of a power conversion device according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference is made to FIG. 1. FIG. 1 is an assembly drawing of a power conversion device 100 according to an embodiment of the present disclosure. The power conversion device 100 is installed on an electric vehicle (not shown). The power conversion device 100 connects an alternating current grid and a battery pack of the electric vehicle through cables, and receives and converts a voltage from the alternating current grid to provide a power to the battery pack of the electric vehicle, in order to charge the electric vehicle.

Figure 2:
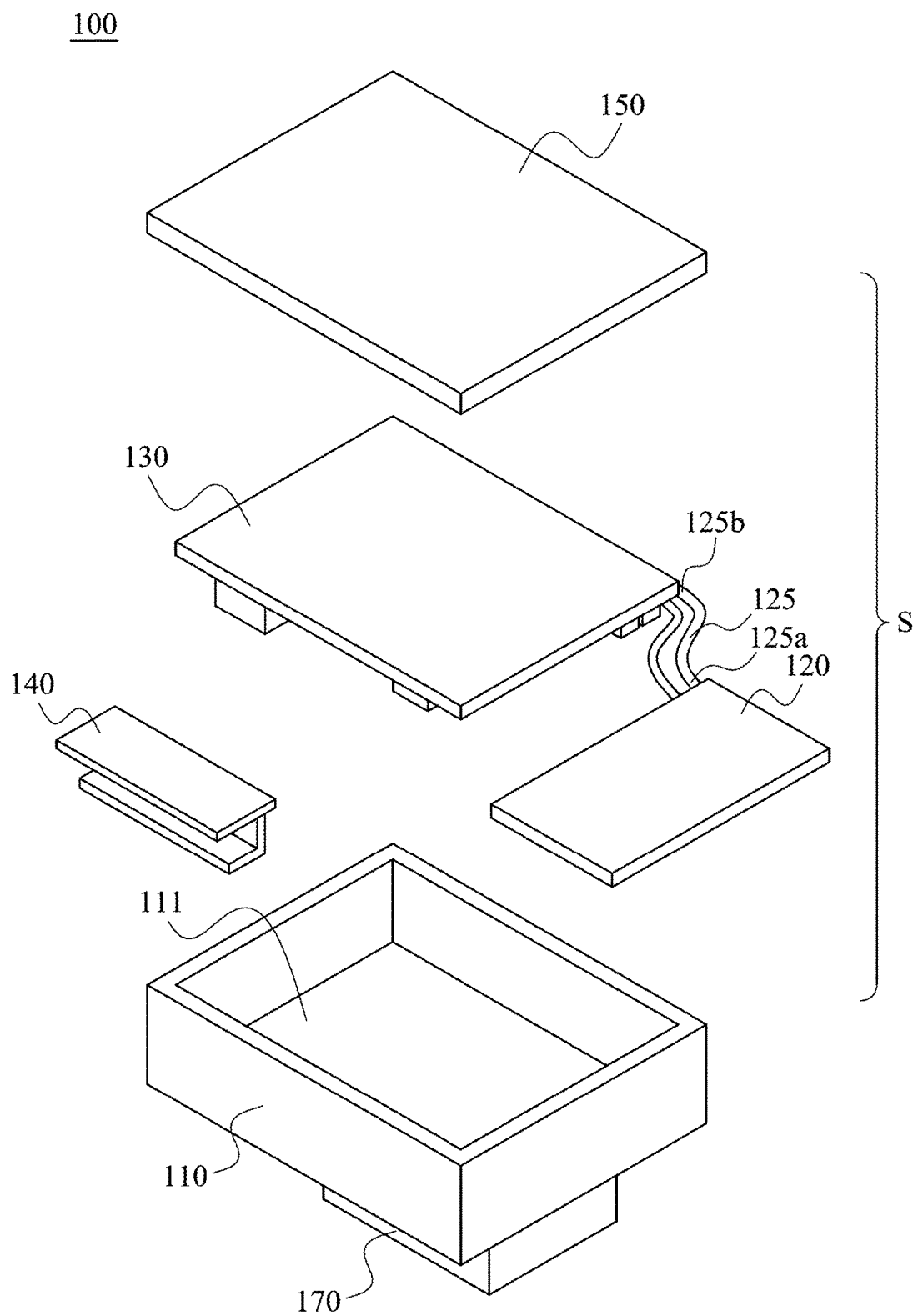
FIG. 2 is an exploded top view of the power conversion device of FIG. 1.
Figure 3:
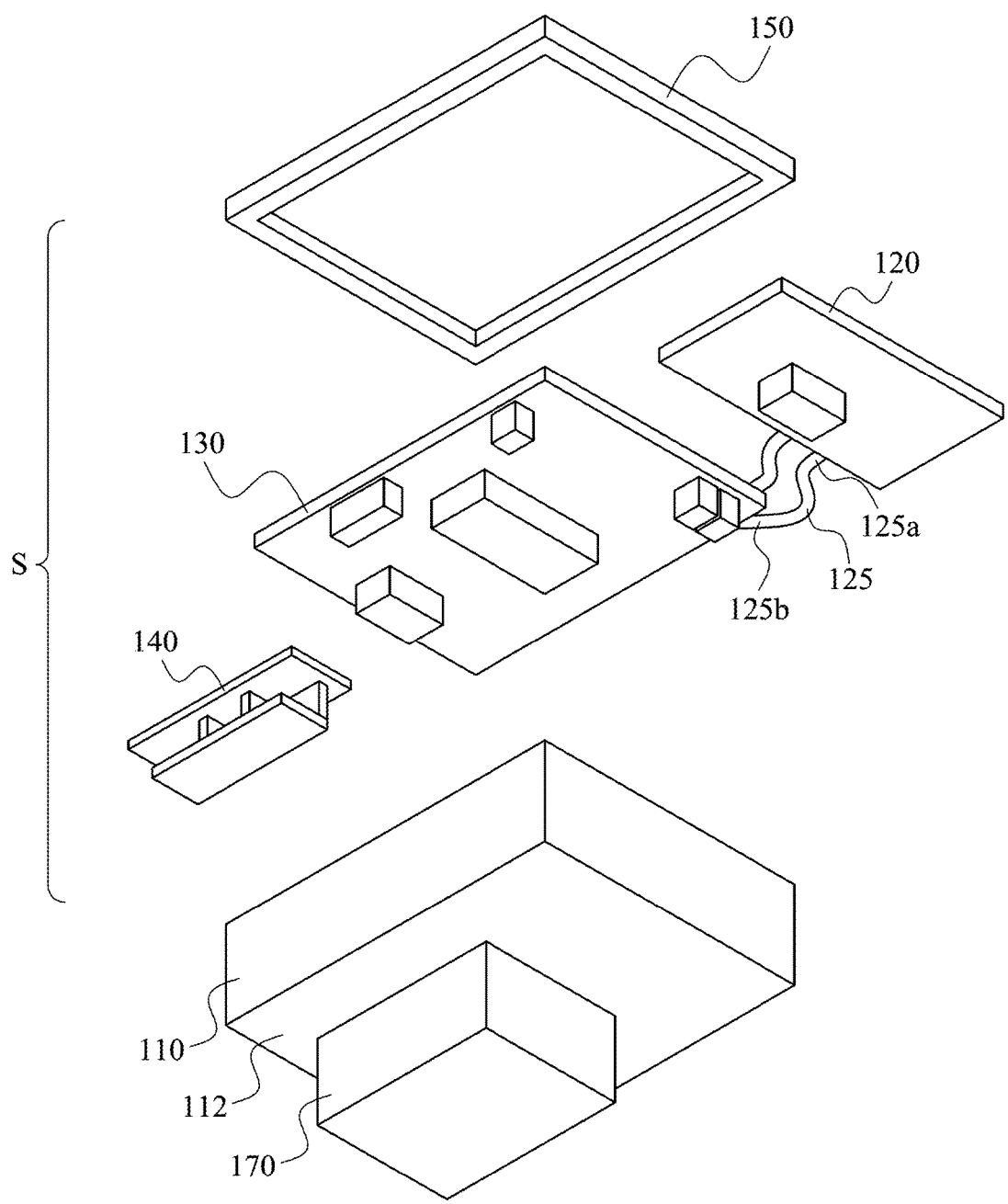
FIG. 3 is an exploded bottom view of the power conversion device of FIG. 1.

Please refer to FIGS. 2-3. FIG. 2 is an exploded top view of the power conversion device 100 of FIG. 1. FIG. 3 is an exploded bottom view of the power conversion device 100 of FIG. 1. As shown in FIGS. 2-3, the power conversion device 100 includes a thermal conductive substrate 110, a DC-to-DC (direct current to direct current) converter circuit assembly 120, an on board charger module (OBCM) circuit assembly 130 and at least one electric wire 125. The thermal conductive substrate 110 has a first surface 111 and a second surface 112 opposite to each other. The DC-to-DC converter circuit assembly 120 is disposed on the first surface 111 of the thermal conductive substrate 110. The on board charger module circuit assembly 130 is disposed on the first surface 111 of the thermal conductive substrate 110 as well. An end 125a of the electric wire 125 connects with the DC-to-DC converter circuit assembly 120, another end 125b of the electric wire 125 connects with the OBCM circuit assembly 130. Thus, the on board charger module circuit assembly 130 is electrically connected with the DC-to-DC converter circuit assembly 120.

In other words, the DC-to-DC converter circuit assembly 120 and the on board charger module circuit assembly 130 are both disposed on the first surface 111 of the thermal conductive substrate 110. This means the DC-to-DC converter circuit assembly 120 and the on board charger module circuit assembly 130 are both located on the same side of the thermal conductive substrate 110. In this way, the relative positions of the DC-to-DC converter circuit assembly 120, the on board charger module circuit assembly 130 and the thermal conductive substrate 110 become closer. Thus, the overall volume of the power conversion device 100 can be effectively reduced.

Figure 4:
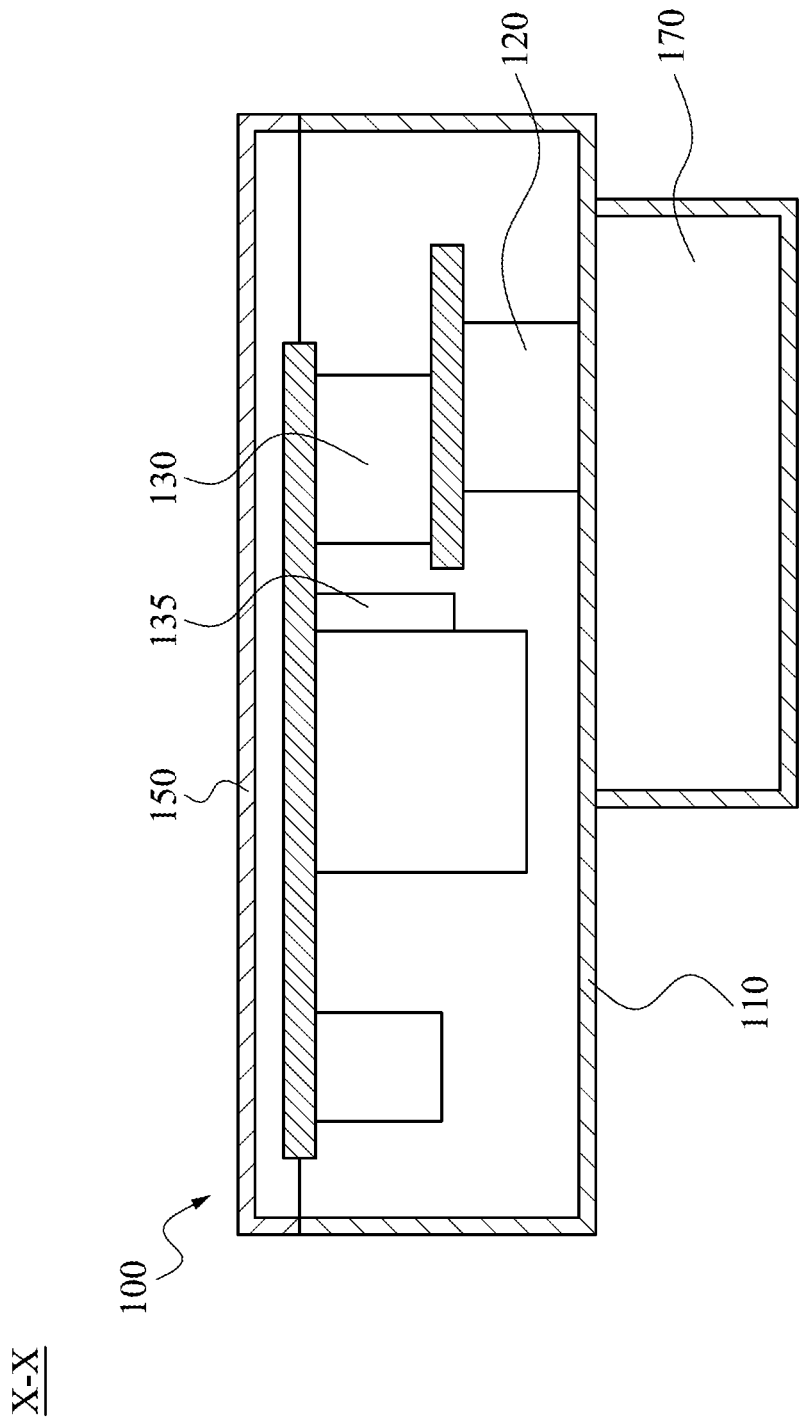
FIG. 4 is a cross-sectional view along the section line X of FIG. 1.

Please refer to FIG. 4. FIG. 4 is a cross-sectional view along the section line X of FIG. 1. To be more specific, as shown in FIG. 4, in this embodiment, the DC-to-DC converter circuit assembly 120 is at least partially disposed under the on board charger module circuit assembly 130, and is close to an output diode 135 of a high voltage direct current, so as to increase the structural density of the power conversion device 100. This facilitates the layout of a flow channel 113 (not shown in FIGS. 1-4, please refer to FIGS. 5-6) in the power conversion device 100, thus increasing the power density of the power conversion device 100.

In addition, as shown in FIGS. 2-3, the power conversion device 100 further includes an electromagnetic interference controller circuit assembly 140. In this embodiment, the electromagnetic interference controller circuit assembly 140 is disposed on the first surface 111 of the thermal conductive substrate 110, and is placed side by side with the DC-to-DC converter circuit assembly 120. As a result, the electromagnetic interference controller circuit assembly 140, the DC-to-DC converter circuit assembly 120 and the on board charger module circuit assembly 130 are all located on the same side of the thermal conductive substrate 110. In this way, the relative positions of the DC-to-DC converter circuit assembly 120, the on board charger module circuit assembly 130, the electromagnetic interference controller circuit assembly 140 and the thermal conductive substrate 110 become closer. Thus, the overall volume of the power conversion device 100 can be effectively reduced.

In addition, as shown in FIGS. 1-4, the power conversion device 100 further includes a top cover 150. The top cover 150 covers the first surface 111 of the thermal conductive substrate 110. A space S is set between the top cover 150 and the first surface 111. The DC-to-DC converter circuit assembly 120, the on board charger module circuit assembly 130 and the electromagnetic interference controller circuit assembly 140 are all located in the space S.

Figure 5:
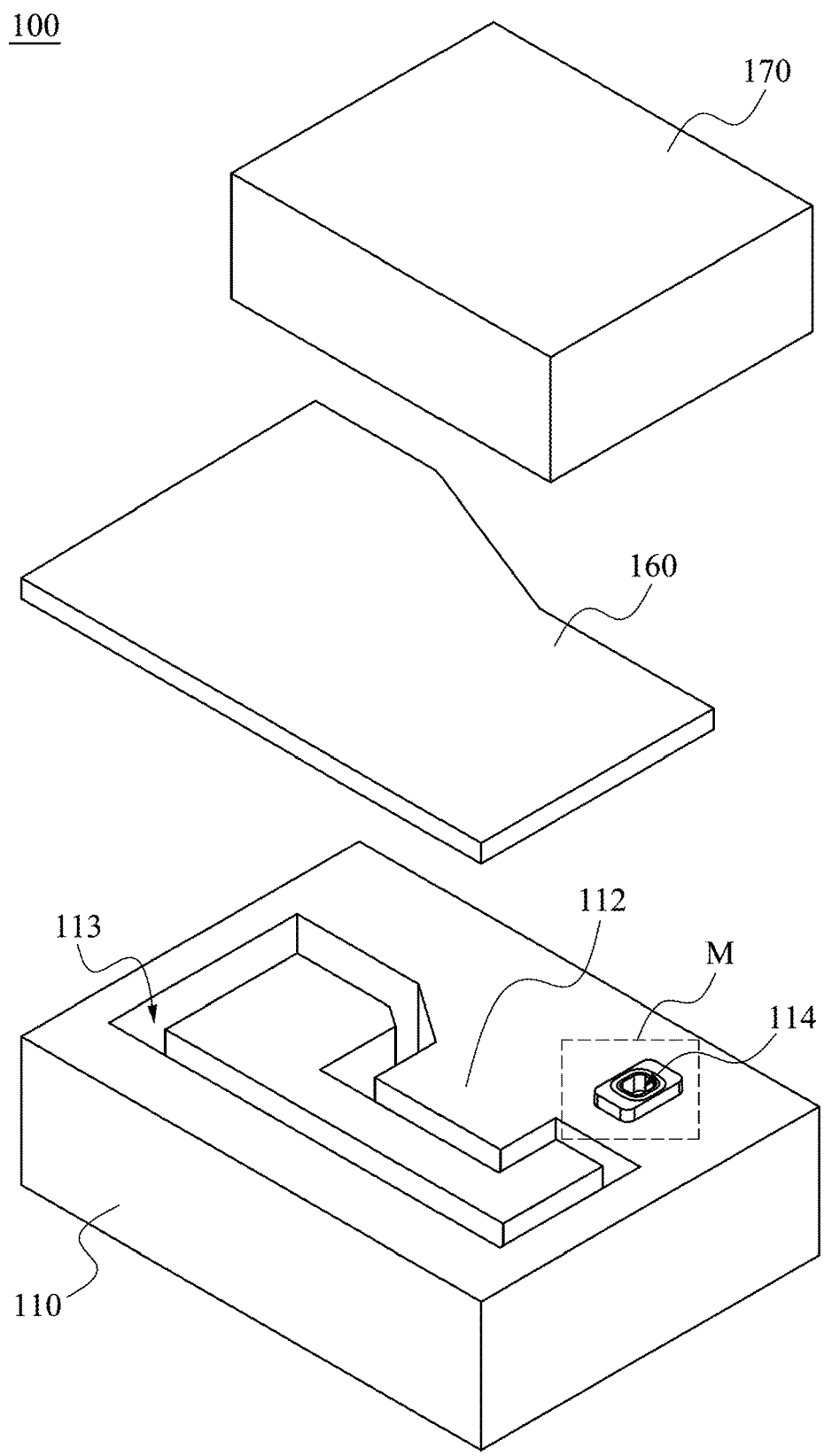
FIG. 5 is an exploded bottom view of the thermal conductive substrate and the power distribution unit of FIG. 1.

Please refer to FIG. 5. FIG. 5 is an exploded bottom view of the thermal conductive substrate 110 and the power distribution unit 170 of FIG. 1. As shown in FIG. 5, the thermal conductive substrate 110 has the flow channel 113. At least a part of the flow channel 113 is located on the second surface 112. In this embodiment, the flow channel 113 is suitable for a cooling fluid (not shown) to flow through, in order to deliver away the heat generated during the operation of the power conversion device 100. In order to reduce the chance of leakage of the cooling fluid from the flow channel 113, the power conversion device 100 further includes a sealing piece 160. The sealing piece 160 seals the flow channel 113. The sealing piece 160 can be a stamping part and is formed by stamping. For example, the material of the sealing piece 160 can be aluminum AL5052. However, this does not intend to limit the present disclosure.

Furthermore, as shown in FIGS. 1-5, the power conversion device 100 further includes a power distribution unit (PDU) 170. In this embodiment, structurally speaking, the power distribution unit 170 is connected with the thermal conductive substrate 110. In addition, as shown in FIG. 5, at least a part of the sealing piece 160 is located between the thermal conductive substrate 110 and the power distribution unit 170. In other words, the sealing piece 160 seals the flow channel 113 of the thermal conductive substrate 110, and at the same time allows the power distribution unit 170 to be disposed over it through tapping holes and bolts. Thus, the overall structure of the power conversion device 100 can be simplified. In practical applications, a casing of the power distribution unit 170 can be formed by die-casting.

On the other hand, as shown in FIG. 5, the thermal conductive substrate 110 has a through hole 114. The through hole 114 penetrates through the first surface 111 (please refer to FIG. 2) and the second surface 112. In addition, the through hole 114 is suitable for an electric cable (not shown) to pass through, such that the power conversion device 100 can be electrically connected. Furthermore, the power distribution unit 170 is electrically connected with the DC-to-DC converter circuit assembly 120 and the on board charger module circuit assembly 130 respectively.

Figure 6:
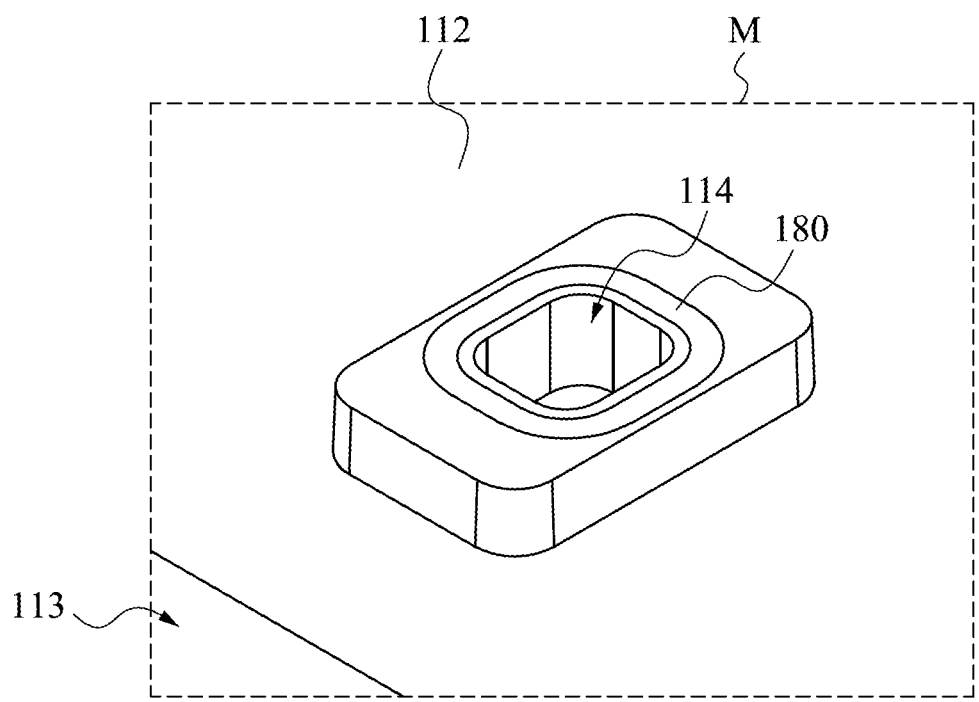
FIG. 6 is a partially magnified view of scope M of FIG. 5.

Please refer to FIG. 6. FIG. 6 is a partially magnified view of scope M of FIG. 5. In order to prevent the cooling fluid from flowing into the through hole 114 and affecting the operation of the power conversion device 100, as shown in FIG. 6, the power conversion device 100 further includes a sealing ring 180. At least a part of the sealing ring 180 is located on the second surface 112 of the thermal conductive substrate 110 and surrounds the through hole 114. In this way, the chance that the flowing fluid flows into the though hole 114 is effectively reduced, and the service life of the power conversion device 100 is thus effectively increased.

Figure 7:
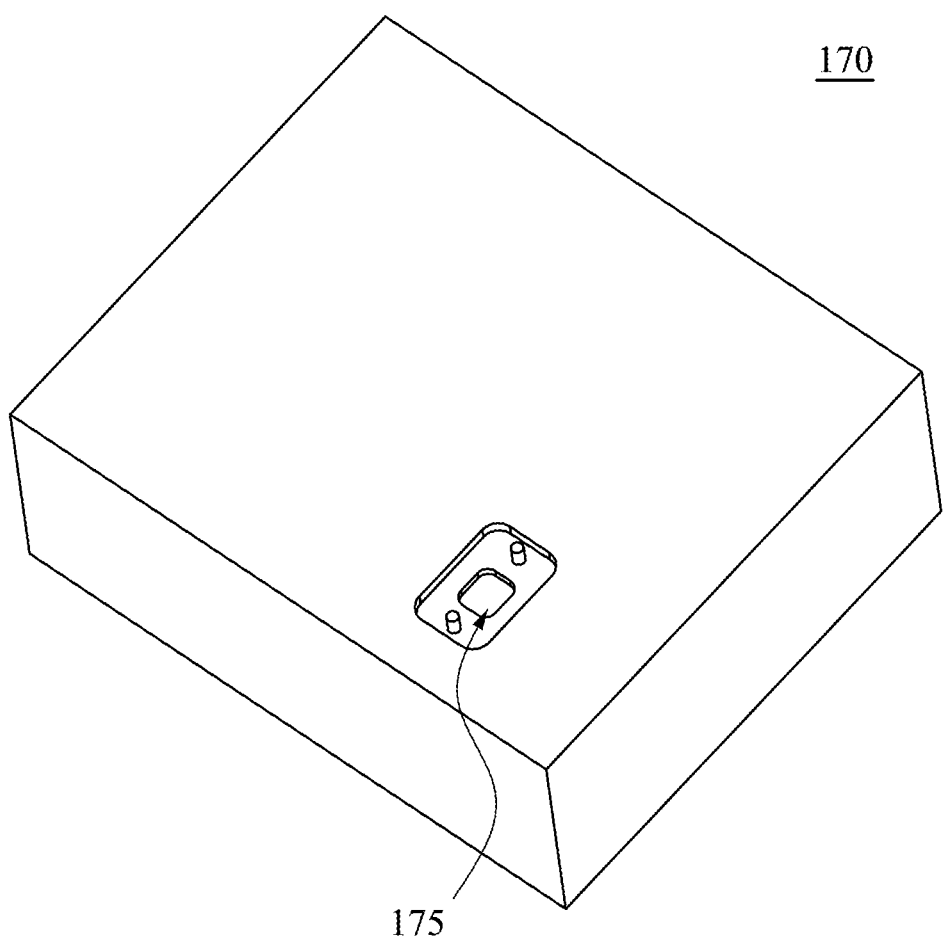
FIG. 7 is a magnified view of the power distribution unit of FIG. 1.

Please refer to FIG. 7. FIG. 7 is a magnified view of the power distribution unit 170 of FIG. 1. As shown in FIG. 7, a surface of the power distribution unit 170 facing to the thermal conductive substrate 110 (please refer to FIGS. 1-6) has a through hole 175. A position of the through hole 175 corresponds to the through hole 114 (please refer to FIGS. 5-6) of the thermal conductive substrate 110. Thus, an electric cable penetrating through the through hole 175 is also able to penetrate through the through hole 114, and to electrically connect inside the power distribution unit 170.

Figure 8:
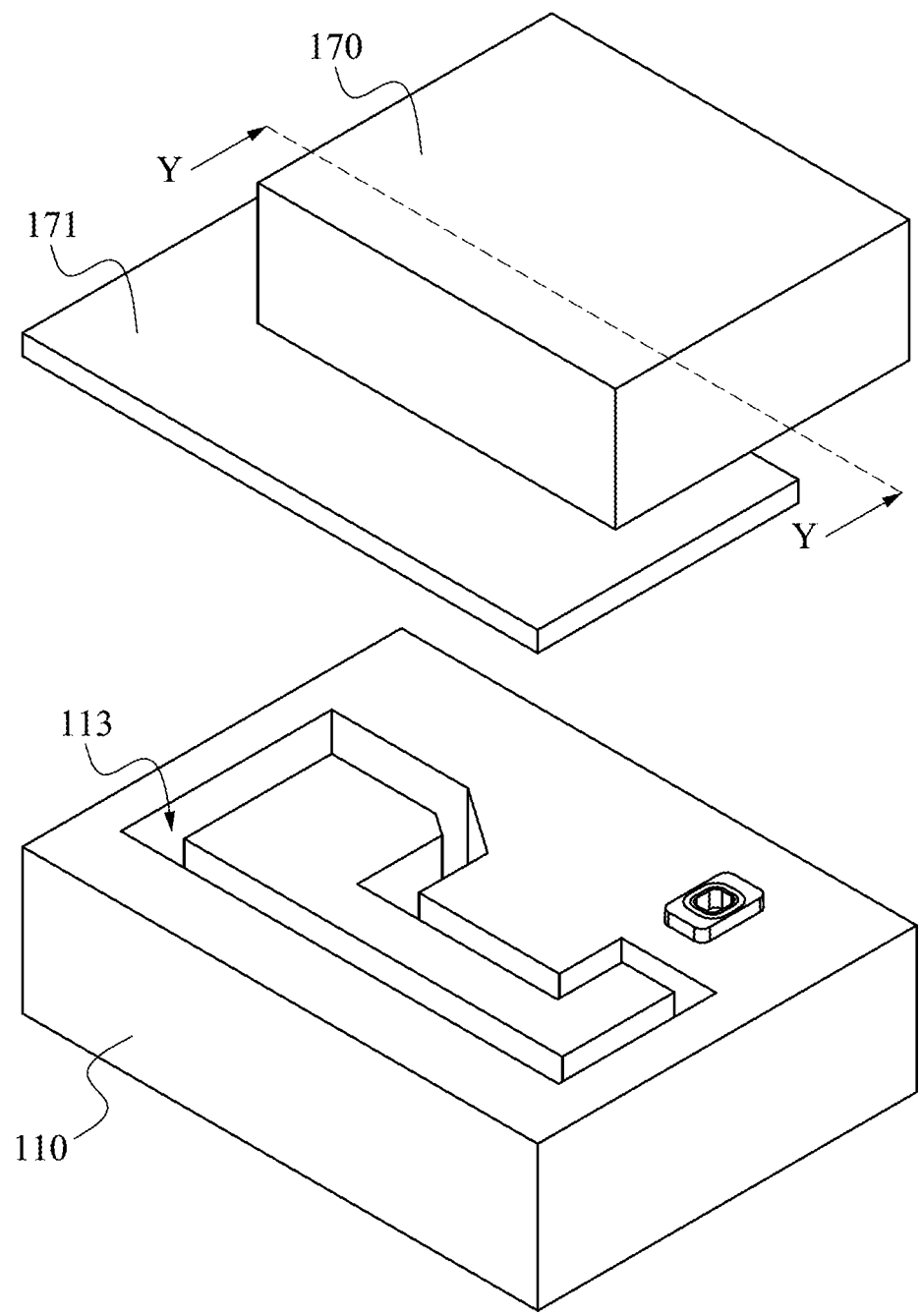
FIG. 8 is an exploded bottom view of a thermal conductive substrate and a power distribution unit according to another embodiment of the present disclosure.

Please refer to FIG. 8. FIG. 8 is an exploded bottom view of a thermal conductive substrate 100 and a power distribution 170 unit according to another embodiment of the present disclosure. In this embodiment, as shown in FIG. 8, the power distribution 170 has a base plate 171. The base plate 171 seals the flow channel 113 of the thermal conductive substrate 110. In other words, as a part of the power distribution 170, the base plate 171 can at the same time be used to seal the flow channel 113 of the thermal conductive substrate 110. In this way, the overall structure of the power conversion device 100 can be simplified. Moreover, in the manufacturing process of the power distribution 170, the casing of the power distribution 170 and the base plate 171 can be manufactured by a single set of die-casting mold. Thus, the development cost of molds can be effectively reduced.

Figure 9:
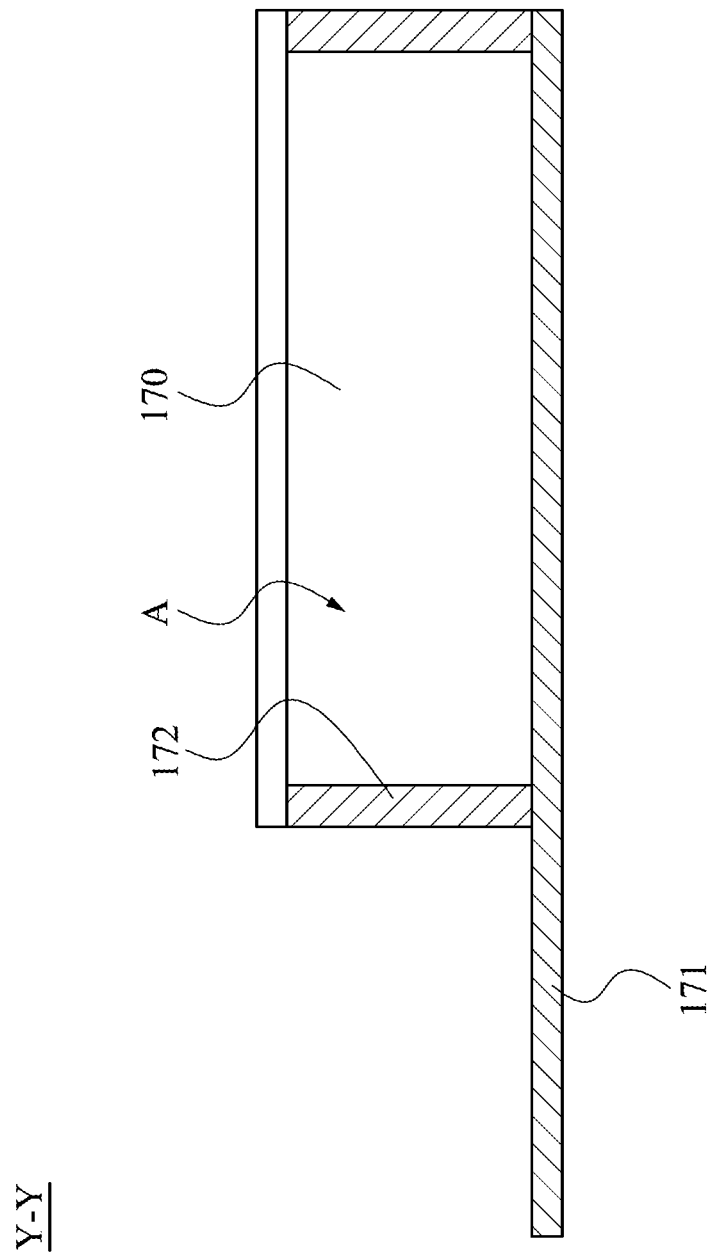
FIG. 9 is a cross-sectional view along the section line Y of FIG. 8.

Please refer to FIG. 9. FIG. 9 is a cross-sectional view along the section line Y of FIG. 8. To be more specific, as shown in FIG. 9, the power distribution unit 170 has at least one side wall 172. The side wall 172 and the base plate 171 form together an accommodating space A, and the base plate 171 protrudes at a side of the side wall 172 away from the accommodating space A. In this way, as mentioned above, the base plate 171 is able to seal the flow channel 113 (please refer to FIG. 8) of the thermal conductive substrate 110. The side wall 172 and the base plate 171 can be integrally formed, such that the structural strength of the side wall 172 and the base plate 171 can be further enhanced. However, this does not intend to limit the present disclosure.

Figure 10:
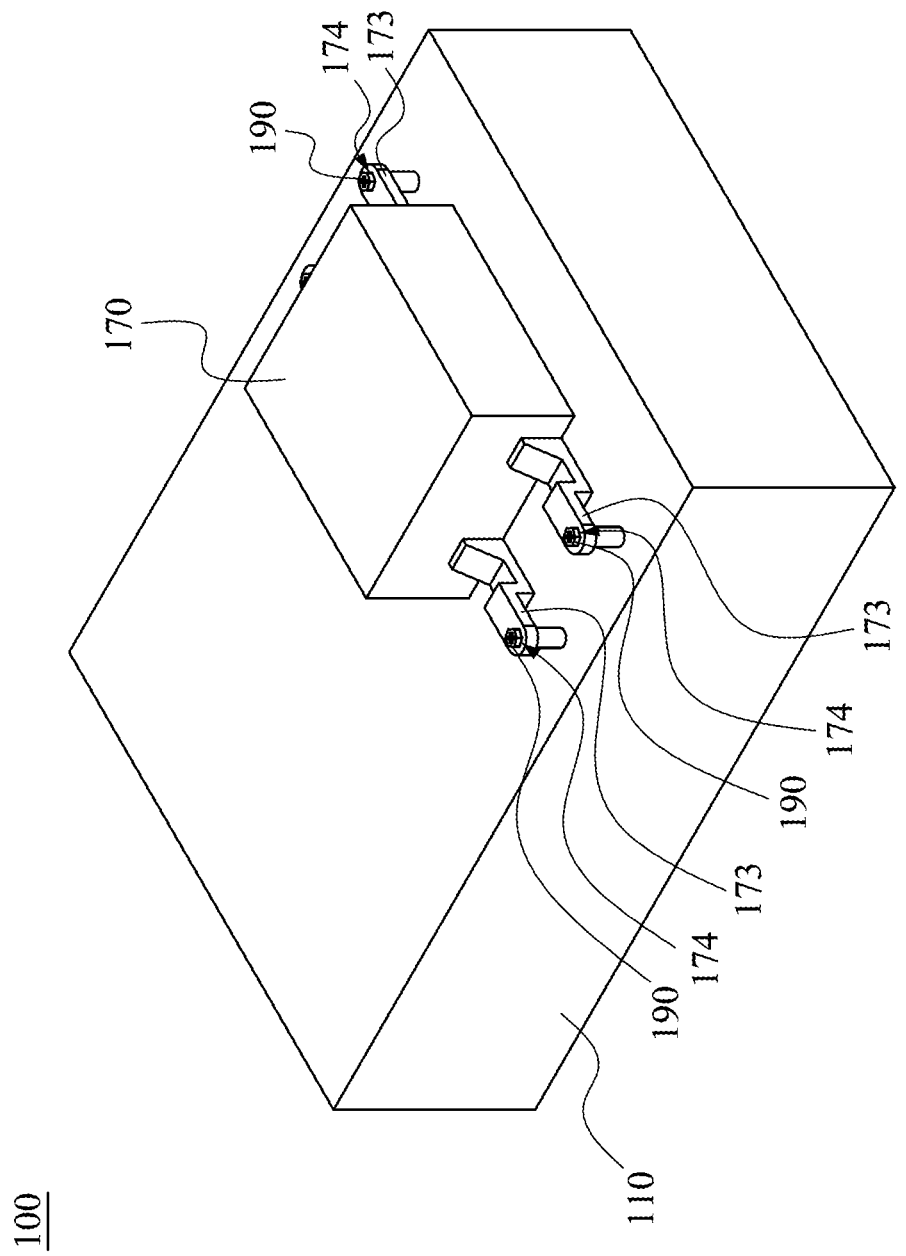
FIG. 10 is an assembly drawing of a power conversion device according to another embodiment of the present disclosure.

Please refer to FIG. 10. FIG. 10 is an assembly drawing of a power conversion device 100 according to another embodiment of the present disclosure. In practical applications, when the thermal conductive substrate 110 has a fuse (not shown) there in, while the power distribution unit 170 does not have a relay (not shown) there in, the volume of the power distribution unit 170 relative to the thermal conductive substrate 110 can be effectively reduced. In such a condition, as shown in FIG. 10, the power distribution unit 170 can have a plurality of installing flanges 173. The installing flanges 173 are located on the casing of the power distribution unit 170. Each of the installing flanges 173 has a through hole 174, and each of the through holes 174 corresponds to a tapping hole on the thermal conductive substrate 110 and a through hole on the sealing piece 160 (the tapping hole on the thermal conductive substrate 110 and the through hole on the sealing piece 160 in FIG. 10 are both blocked by the installing flanges 173). In this way, a user can make use a fastening piece 190 such as a screw, to fix the through hole 174 relative to the tapping hole, such that the power distribution unit 170 can be fixed on the thermal conductive substrate 110 in a simple and easy manner. In this way, with regard to the different functional requirements of the power distribution unit 170, the user can still adopt the same casing of the thermal conductive substrate 110, in order to reduce the cost and unit price of the mold. In this embodiment, as shown in FIG. 8, the quantity of the installing flanges 173 is three. However, this does not intend to limit the present disclosure.

In conclusion, as compared with the prior art, the aforementioned embodiments of the present disclosure have at least the following advantages.

(1) Since the DC-to-DC converter circuit assembly and the on board charger module circuit assembly are both located on the same side of the thermal conductive substrate, the relative positions of the DC-to-DC converter circuit assembly, the on board charger module circuit assembly and the thermal conductive substrate become closer. Thus, the overall volume of the power conversion device can be effectively reduced.

(2) Since the power distribution unit is connected with the thermal conductive substrate, and at least a part of the sealing piece is located between the thermal conductive substrate and the power distribution unit, the sealing piece seals the flow channel of the thermal conductive substrate, and at the same time allows the power distribution unit to be disposed over it. Thus, the overall structure of the power conversion device can be simplified.

(3) Since the power distribution has a base plate, and the base plate seals the flow channel of the thermal conductive substrate, as a part of the power distribution, the base plate can at the same time be used to seal the flow channel of the thermal conductive substrate. In this way, the overall structure of the power conversion device can be simplified. Moreover, in the manufacturing process of the power distribution, the casing of the power distribution and the base plate can be manufactured by a single set of die casting mold. Thus, the development cost of molds can be effectively reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A power conversion device, comprising:
    a thermal conductive substrate having a first surface and a second surface opposite to each other;
    an electromagnetic interference controller circuit assembly disposed on the first surface;
    an on board charger module circuit assembly disposed on the first surface;
    a DC-to-DC converter circuit assembly disposed between the on board charger module circuit assembly and the first surface of the thermal conductive substrate, the electromagnetic interference controller circuit assembly and the DC-to-DC converter circuit assembly are placed side by side; and
    at least one electric wire, an end of the electric wire connecting with the DC-to-DC converter circuit assembly, another end of the electric wire connecting with the on board charger module circuit assembly.

2. The power conversion device of claim 1, further comprising a top cover covering the first surface, and a space being set between the top cover and the first surface, wherein the DC-to-DC converter circuit assembly and the on board charger module circuit assembly are located in the space.

3. The power conversion device of claim 1, wherein the thermal conductive substrate has a flow channel and at least a part of the flow channel is located on the second surface; and
    further comprising a sealing piece sealing the flow channel.

4. The power conversion device of claim 3, wherein the sealing piece is a stamping part.

5. The power conversion device of claim 3, further comprising a power distribution unit connected with the thermal conductive substrate, and at least a part of the sealing piece being located between the thermal conductive substrate and the power distribution unit.

6. The power conversion device of claim 1, wherein the thermal conductive substrate has a flow channel and at least a part of the flow channel is located on the second surface; and further comprising a power distribution unit connected with the thermal conductive substrate, and the power distribution unit having a base plate sealing the flow channel.

7. The power conversion device of claim 6, wherein the power distribution unit has at least one side wall, the side wall and the base plate collectively define an accommodating space, and the base plate protrudes at a side of the side wall away from the accommodating space.

8. The power conversion device of claim 7, wherein the side wall and the base plate are integrally formed.

9. The power conversion device of claim 1, wherein the thermal conductive substrate has a through hole penetrating through the first surface and the second surface; and further comprising a sealing ring and at least a part of the sealing ring being located on the second surface and surrounding the through hole.

* * * * *